(12) United States Patent
Henninger et al.

(10) Patent No.: US 7,060,562 B2
(45) Date of Patent: Jun. 13, 2006

(54) METHOD FOR FABRICATING GATE ELECTRODES IN A FIELD PLATE TRENCH TRANSISTOR, AND FIELD PLATE TRENCH TRANSISTOR

(75) Inventors: Ralf Henninger, München (DE); Franz Hirler, Isen (DE); Uli Hiller, Bad Abbach (DE); Jan Ropohl, Regensburg (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 11/051,248

(22) Filed: Feb. 4, 2005

(65) Prior Publication Data

US 2005/0215010 A1 Sep. 29, 2005

(30) Foreign Application Priority Data

Feb. 5, 2004 (DE) .................. 10 2004 005 774

(51) Int. Cl.
*H01L 21/22* (2006.01)
*H01L 29/76* (2006.01)

(52) U.S. Cl. .............. 438/259; 438/456.4; 438/488; 438/140; 438/137; 438/270; 438/257; 438/258; 257/330; 257/328; 257/491; 257/493; 257/500; 257/135; 257/239

(58) Field of Classification Search .......... 438/259, 438/454, 488, 140, 137, 270, 257, 258; 257/330, 257/328, 491, 493, 500, 135, 239
See application file for complete search history.

(56) References Cited

U.S. PATENT DOCUMENTS

| 6,924,198 B1* | 8/2005 | Williams et al. ............ 438/270 |
| 2003/0173618 A1* | 9/2003 | Zundel et al. .............. 257/329 |
| 2004/0026737 A1* | 2/2004 | Zundel et al. .............. 257/330 |
| 2004/0031987 A1 | 2/2004 | Henninger et al. |
| 2004/0089910 A1 | 5/2004 | Hirler et al. |
| 2004/0104428 A1* | 6/2004 | Henninger et al. ......... 257/331 |

FOREIGN PATENT DOCUMENTS

DE 102 34 996 A1 10/2003

* cited by examiner

*Primary Examiner*—B. William Baumeister
*Assistant Examiner*—Victor V. Yevsikov
(74) *Attorney, Agent, or Firm*—Maginot, Moore & Beck

(57) ABSTRACT

A method for fabricating gate electrodes (7) in a field plate trench transistor (1) having a cell array with a plurality of trenches (3) and a plurality of mesa regions (8) arranged between the trenches comprises the following steps: application of a gate electrode layer (7) to the cell array in such a way that the gate electrode layer (7) has depressions within or above the trenches (3), application of a mask layer (10) to the cell array, etching-back of the mask layer (10) in such a way that mask layer residues (10) remain only within the depressions of the gate electrode layer (7), and etching-back of the gate electrode layer (7) using the mask layer residues (10) as an etching mask in such a way that gate electrode layer residues (7) remain only within/above the trenches (3).

20 Claims, 3 Drawing Sheets

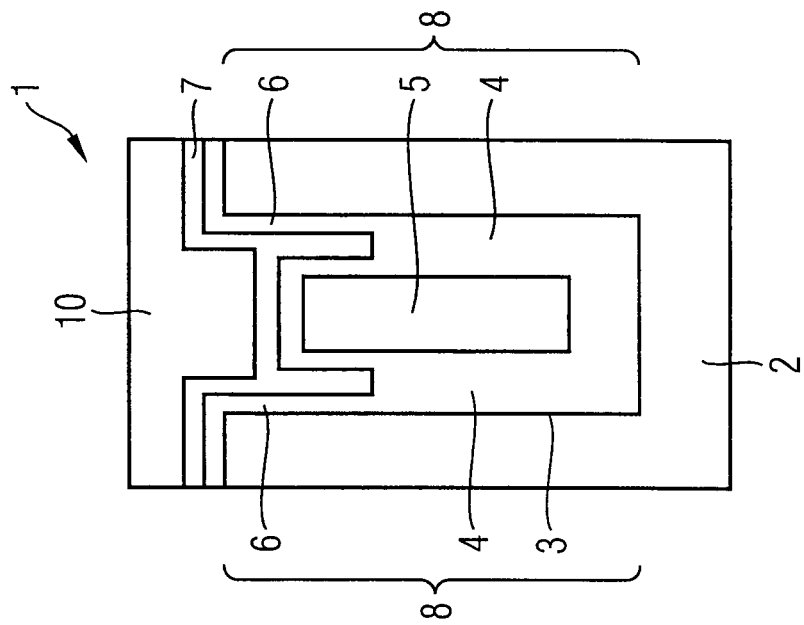
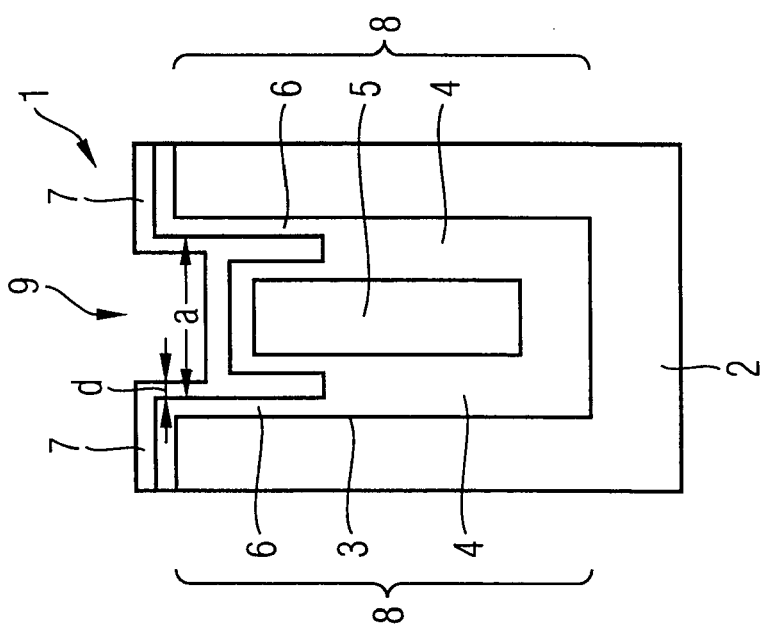

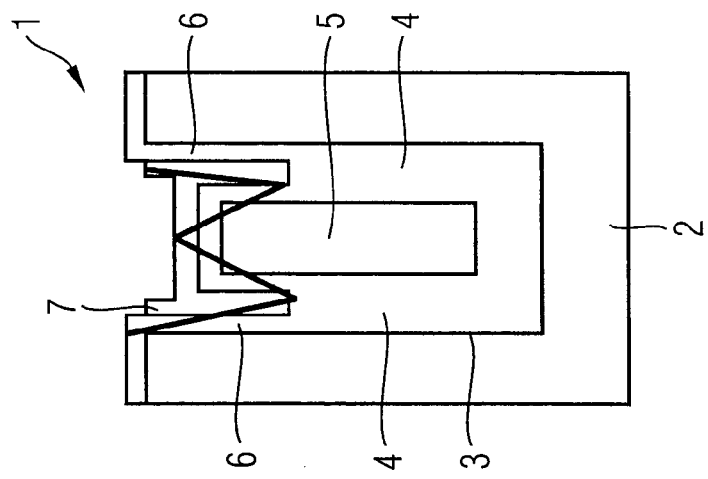
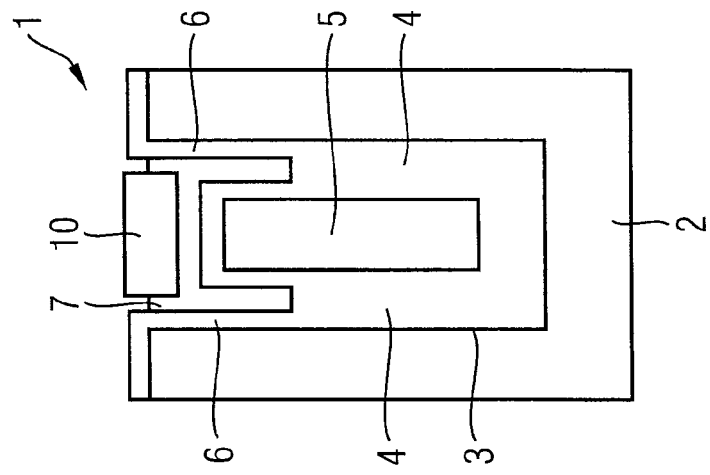
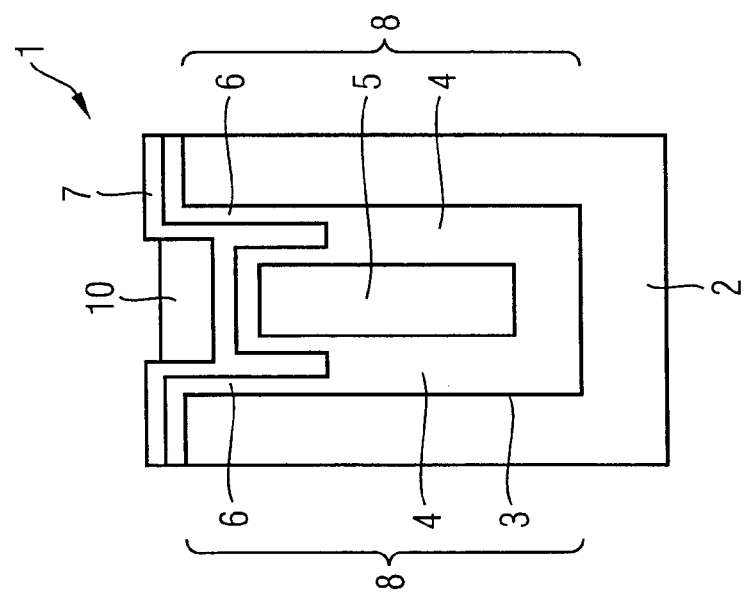

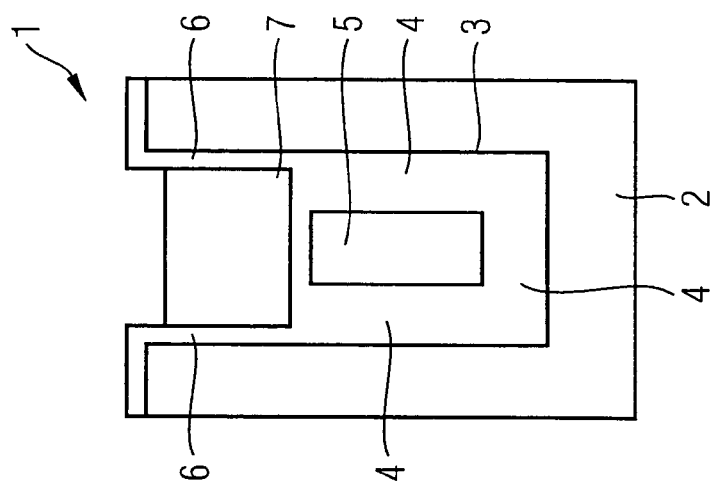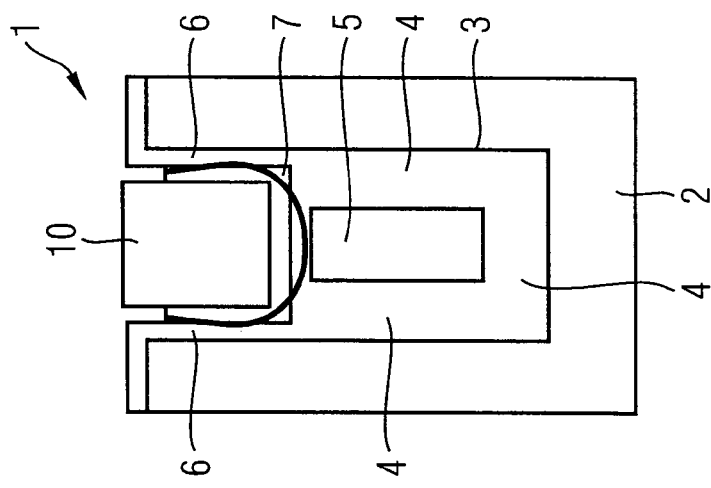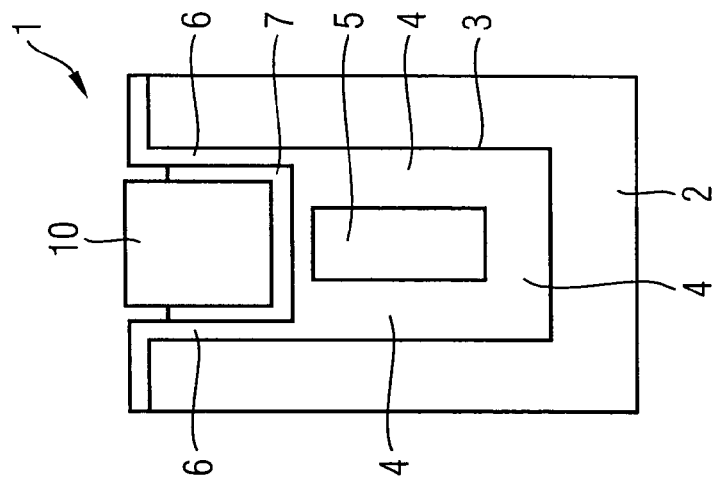

METHOD FOR FABRICATING GATE ELECTRODES IN A FIELD PLATE TRENCH TRANSISTOR, AND FIELD PLATE TRENCH TRANSISTOR

FIELD OF THE INVENTION

The invention relates to a method for fabricating gate electrodes in a field plate trench transistor, and to a field plate trench transistor.

BACKGROUND

Field plate trench transistors are known semiconductor components and have a cell array, in which a plurality of trenches are provided. The trenches are separated from one another by mesa regions (semiconductor regions that enclose the trenches or adjoin the trenches). Source, body and drift regions are provided in the mesa regions.

Two electrodes are usually formed in field plate trench transistors: in a lower region of the trench, a field electrode ("field plate") is provided, which is electrically insulated from the inner walls of the trench by means of an insulation layer (e.g. a field oxide layer). In an upper region of the trench, a gate electrode is provided, which is electrically insulated from the inner walls of the trench by means of one or more insulation layers (e.g. by means of two mutually opposite gate oxide layers). The field electrode is preferably electrically insulated from the gate electrode (for example by parts of a gate oxide layer or a field oxide layer). Usually, the field electrode and also the insulation layer enclosing the field electrode completely fill the lower part of the trench. The vertical extent of the field electrode is preferably configured such that it essentially corresponds to the vertical extents of the drift regions provided in the adjacent mesa regions.

The field electrode serves to provide, in the off state of the field plate trench transistor, countercharges with respect to the ionized dopant atoms in the drift zones, which are localized in the adjoining mesa regions. The provision of the countercharges brings about a depletion of charge carriers in the drift zones and thus an improvement in the blocking capability of the field plate trench transistor in the off state. The gate electrode in the upper part of the trench serves to form channels in the body regions, i.e. to switch the transistor from an off state to an on state.

The blocking capability of the field plate trench transistor depends to a large extent on the thickness of the insulation layer for insulation of the field electrode in the lower region of the trench. The thickness of a field oxide layer for a 100 V blocking field plate trench transistor is typically 500 to 1500 nm. If the blocking capability is to be increased, then the field oxide has to be thickened. However, thickening the field oxide generally also results in widening of the gate electrode. Moreover, since the thickness of a gate oxide layer turns out to be significantly smaller than the thickness of the field oxide layer, the gate electrode enclosed by the gate oxide layer takes up a very large volume (the entire free space enclosed by the gate oxide layer is usually filled with gate electrode material).

SUMMARY

Admittedly, a "voluminous" configuration of the gate electrode enables a large gate electrode cross-sectional area and thus a low gate resistance, which is advantageous. What is disadvantageous, however, is that voluminous gate electrodes are difficult to handle in terms of production technology. A gate electrode layer (for example polysilicon) whose thickness is approximately equal to or greater than half the trench width between mutually opposite gate oxide surfaces (i.e. half the width of the free space enclosed by the gate oxide surfaces) is typically required for filling the free space enclosed by the gate oxide layer above the field electrode. After the free space has been filled with gate electrode material, the gate electrode material is etched back into the trench by means of an etching-back process, preferably as far as a depth corresponding to the junction between the source region and the body region in the mesa region.

The object on which the invention is based is to specify a method for fabricating gate electrodes in a field plate trench transistor which makes it possible to avoid production-technological difficulties resulting from voluminous configurations of the gate electrodes.

In order to achieve this object, embodiments of the invention include a method for fabricating gate electrodes and a field plate trench transistor.

The method according to the invention for fabricating gate electrodes in a field plate trench transistor having a cell array with a plurality of trenches and a plurality of mesa regions arranged between the trenches comprises the following steps:

application of a gate electrode layer to the cell array in such a way that the gate electrode layer has depressions within or above the trenches, application of a mask layer to the cell array, etching-back of the mask layer in such a way that mask layer residues remain only within the depressions of the gate electrode layer, etching-back of the gate electrode layer using the mask layer residues as an etching mask in such a way that gate electrode layer residues remain only within/above the trenches.

The term "mask layer residue" here means a (desirable) contiguous, area-covering layer made of mask material, that is to say not just an undesirable "residual contamination". The same applies to the term "gate electrode layer residue".

Accordingly, according to the invention, it is no longer necessary for the entire free space above the field electrodes or the insulation layers (e.g. field oxide) enclosing the field electrodes, which is delimited by corresponding insulation layers (e.g. gate oxide layers), to be filled with gate electrode material, rather the deposition of a relatively thin gate electrode layer is sufficient. If the gate electrode layer is deposited as a layer having an essentially homogenous thickness, depressions form within/above the trenches, said depressions being utilized by the method according to the invention. The hitherto unfilled parts of the trenches or the depressions of the gate electrode layer are completely or partly filled by application of the mask layer. The gate electrode thus has a large cross-sectional area in conjunction with a small deposition thickness. The fabrication of a gate electrode with a small deposition thickness can be realized in a very favorable manner in terms of production technology.

The gate resistance can be set to any desired value by a corresponding choice of the thickness of the gate electrode layer. The thickness of the gate electrode layer is preferably chosen such that it is less than half of the distance between mutually opposite (i.e. arranged at the same vertical height) insulation layers provided in the upper part of the trenches and serving for insulating the gate (e.g. gate oxide layer parts).

The thickness of the mask layer is preferably chosen such that hitherto unfilled parts of the trenches, i.e. the free spaces remaining above the gate electrode, are completely filled by the mask layer.

In order to ensure that only mask layer residues remain within the trenches after the etching process for the mask layer, the mask layer is advantageously planarized prior to the corresponding etching-back process. A number of possibilities are taken into consideration for the planarization of the mask layer: a first possibility consists in planarizing the mask layer after its application by means of a chemical mechanical removal process. A further possibility consists in choosing for the mask layer a material which can be subjected to a flow process after it has been applied. By way of example, it is possible to use BPSG (borophosphosilicate glass) as mask material which can be caused to flow by means of a heating process after it has been applied. A further possibility consists in choosing the material of the mask layer or the deposition temperature such that the flow process takes place simultaneously with the deposition process for the mask layer (self-planarizing material).

The planarization process has the effect that the thickness of the mask layer above the mesa regions is smaller than the thickness of the mask layer within/above the trenches. This ensures that in a corresponding mask layer etching process, when the etching front impinges on the gate electrode layer, i.e. after complete removal of the mask layer above the mesa regions, a certain mask layer residue is still present within/above the trenches, i.e. within the depressions of the gate electrode layer. Consequently, mask layer blocks can be produced in a targeted manner within/above the trenches in a self-aligning manner, i.e. without the use of corresponding exposure processes.

The mask layer blocks within/above the trenches enable a self-aligning lateral etching process for the gate electrode layer, i.e. the mask layer blocks ensure that the gate electrode layer is removed only above the mesa regions, but it largely remains within/above the trenches. The lateral orientation of the gate electrodes is accordingly effected without the use of corresponding exposure processes, that is to say is a self-aligning process just like the orientation of the mask layer blocks. The invention's use of self-aligning processes enables a simplification of the gate electrode fabrication method and thus a reduction of costs.

The mask layer may comprise arbitrary suitable materials. Photoresist, BPSG, oxide, polysilicon, BARC (Bottom Anti Reflective Coating) or other suitable materials shall be cited here by way of example.

The mask layer may be formed from an individual material or be realized as a layer system comprising a plurality of materials. If the mask layer is formed from a first layer and a second layer (for example from an oxide layer (first layer) and a polysilicon layer (second layer)), then the etching-back process for the mask layer is advantageously effected by a procedure in which, in a first step, the second layer is etched back such that residues of the second layer remain only within the trenches and, in a second step, the first layer is etched back using the layer residues of the second layer as an etching mask such that residues of the first layer remain only within the trenches. The etching-back process for the gate electrode layer is effected selectively with respect to the first layer in this example. Since the first layer can be made very thin on account of the layer system (the filling is essentially effected by the second layer), very precise gate electrode patternings can be achieved in this way. Prior to the etching-back process for the gate electrode layer, the second layer of the mask layer may be removed by means of an etching process.

The etching-back process for the gate electrode layer may be effected in two steps, in which case, in a first step, the gate electrode layer is only partly etched back above the mesa regions, then the mask layer residues are removed, and is subsequently etched back, in a second step, precisely to such an extent that the gate electrode layer parts that have remained above the mesa regions are etched away. This has the advantage over an etching-back process effected in a single step that it is possible to avoid influences of mask layer residues that have remained undesirably above the mesa regions on the etching-back process for the gate electrode layer.

The invention furthermore provides a field plate trench transistor. The latter has a cell array, in which a plurality of trenches and a plurality of mesa regions arranged between the trenches are provided. The following are in each case provided within a trench: a field electrode, a first insulation layer enclosing the field electrode, a gate electrode layer arranged above the field electrode, and at least two mutually opposite second insulation layers adjoining the gate electrode layer and enclosing the gate electrode layer. The thickness of the gate electrode layer is less than half of the distance between the mutually opposite second insulation layers.

The first insulation layer and/or the second insulation layers are preferably oxide layers.

In this case, the gate electrode layer preferably has a U- or W-shaped configuration.

BRIEF DESCRIPTION OF THE DRAWINGS

The invention is explained in more detail below in an exemplary embodiment with reference to the accompanying figures, in which:

FIG. 1a to 1e show a first to fourth process step of a preferred embodiment of the fabrication method according to the invention.

FIGS. 2a, b show a field plate trench transistor with an alternative gate electrode form in comparison with FIG. 1a to 1e, which has been fabricated by the method according to the invention.

FIG. 3 shows a field plate trench transistor in accordance with the prior art.

DETAILED DESCRIPTION

In the figures, identical or mutually corresponding parts and/or regions are identified by the same reference numerals.

FIG. 1a shows a detail from a field plate trench transistor 1 in a cross-sectional illustration, a semiconductor volume 2, a trench 3 formed in the semiconductor volume 2, a field oxide layer 4, a field electrode 5 enclosed by the field oxide layer 4, gate oxide layers 6, and a gate electrode layer 7 insulated from the field electrode being discernible. The parts of the semiconductor volume 2 which adjoin the trench 3 on the left and right represent corresponding mesa regions 8. The field oxide layer 4 and the gate oxide layers 6 may also comprise a different suitable insulation material.

Production-technological aspects of the process steps which are necessary for fabricating the field plate trench transistor 1 shown in FIG. 1a are known to the person skilled in the art and, therefore, will not be explained at this juncture.

FIG. 1a corresponds to the first process state of a preferred embodiment of the fabrication method according to the invention. As can be gathered from FIG. 1a, the gate electrode layer 7 has a relatively small layer thickness, so that a free space 9 remains within the trench, that is to say that the gate electrode layer 7 does not fill the complete trench 3. The gate electrode layer 7 accordingly has a depression within the trench 3. The depression also arises when the gate electrode layer 7 essentially has a homogenous thickness that is chosen such that the trench 3 is completely filled by the gate electrode layer 7. In this case, the depression within the gate electrode layer 7 is localized above rather than within the trench 3. A thickness d of the gate electrode layer 7 is preferably chosen such that it is less than half of a distance a between mutually opposite gate oxide layers 6 adjoining the gate electrode layer 7.

In a second process step, which is shown in FIG. 1b, a mask layer 10 is applied to the gate electrode layer 7. The mask layer 10 is planarized after application, for example by means of a flow process or by chemical mechanical removal.

In a third process step, which is shown in FIG. 1c, the mask layer 10 is etched back by means of a preferably anisotropic etching process, so that a residue of the mask layer 10 only remains within the free space 9. If the mask layer 10 is formed as a layer system comprising a plurality of different materials, then the etching-back process for the mask layer 10 may possibly be effected in stages, i.e. in a plurality of steps.

A selective etching-back process for the gate electrode layer 7 is then effected, as is shown in FIG. 1d, the residues of the mask layer 10 which have remained in the free space 9 functioning as an etching mask and having the effect that the gate electrode layer 7 is removed only above the mesa regions 8 and in the edge regions of the trench 3. After the etching-back process for the gate electrode layer 7, the residues of the mask layer 10 may be removed.

In an alternative embodiment of the method according to the invention, during the etching-back process for the gate electrode layer 7, the latter is etched back only in part above the mesa regions 8. Afterward, the residues of the mask layer 10 are completely removed. The residue of the gate electrode layer 7 is then removed above the mesa regions 8 (area-covering etching process which is carried out until the residue of the gate electrode layer 7 has been removed above the mesa regions 8). The advantage in this case is that possible influences of residues of the mask layer 10 (e.g. polymer residues) on the gate electrode layer etching are small or can be eliminated.

In a further alternative embodiment of the method according to the invention, the mask layer 10 comprises a first and a second layer. By way of example, firstly an oxide layer (first layer) is deposited onto the gate electrode layer, and subsequently a polysilicon layer (second layer). The polysilicon layer is then etched back such that a polysilicon block only remains within the free space 9 in the trench 3. The underlying oxide layer is then etched using the polysilicon block as an etching mask in such a way that a residue of the oxide layer only remains below the polysilicon block in the trench 3. Afterward, the gate electrode layer 7 is etched in the manner described above using the residue of the oxide layer in the trench 3 as an etching mask. The advantage of this alternative embodiment is that the oxide layer may have a very small thickness and very precise etchings of the gate electrode layer 7 are thus possible. Furthermore, the influence of polymer residues on the gate electrode layer etching is small. Instead of a polysilicon material, any other suitable material, for example a photoresist, may also be used in this embodiment. The same applies to the oxide layer.

The invention is not restricted to the above-described materials for the mask layer 10. Arbitrary materials familiar to the person skilled in the art may be used. Furthermore, the invention is not restricted to specific materials for the gate electrode layer 7. The gate electrode layer 7 preferably comprises polysilicon.

The forms of the gate electrode layers 7 may have an arbitrary form. Thus, FIGS. 1a to 1d show a W-shaped structure, as indicated by the "W" in FIG. 1e, and FIG. 2a shows a U-shaped structure, as is indicated by the "U" in FIG. 2b. In FIGS. 1e and 2b, the mask layer residues 10 are omitted in order to illustrate the gate electrode layer forms. The invention is not restricted to these embodiments of the gate electrode layers 7.

FIG. 3 reveals a field plate trench transistor in accordance with the prior art. In this case, the gate electrode 7 of this field plate trench transistor does not have a layer-type structure but rather a block-type form.

In FIGS. 2a, b, the vertical extent of the field electrode 5 is smaller than in FIGS. 1a to 1d. Consequently, the gate electrode layer 7 reaches further into the trench 3.

If the material of the mask layer 10 is not sufficiently thermostable, which may be the case with photoresist or BARC, by way of example, then the mask layer 10 should be removed again, for example, by means of an etching process, after formation of the gate electrode layer residues within/above the trenches 3. An insulating layer may subsequently be applied, which for its part fills free spaces formerly filled by the mask layer residues. It is particularly advantageous if a sufficiently thermostable mask material is chosen. In this case, the mask layer residues do not have to be removed after the formation of the gate electrode residues and may, for their part, serve as an insulating layer depending on the choice of masking material.

According to the invention, then, only a small layer thickness in comparison with the trench width is deposited in order to form the gate electrode. A residual opening in the trench is filled with photoresist, by way of example, and etched back right into the trench. The "resist plug" serves for masking the poly material in the trench for a subsequent poly etching which serves for removing the polysilicon film above a defined depth. The layer thickness is advantageously to be chosen such that a cross-sectional area of the gate electrode produces an envisaged value of the gate resistance. The advantages of the fabrication method according to the invention are short deposition time, low process costs, a small fluctuation of the etching depth over the cell array (wafer) on account of the small layer thickness fluctuation of the gate electrode layer over the cell array (wafer) (homogeneity). Furthermore, a shallow etching-back process is possible.

Accordingly, according to the invention, the gate electrode form is realized by means of a self-aligned mask process.

Further process steps which are necessary for "completing" the field plate trench transistor, such as, by way of example, the application of intermediate oxide layers, the production of contact holes and the production of a metallization layer for making contact with the field plate trench transistor, are known to the person skilled in the art and, therefore, are not discussed here.

It goes without saying that the invention can be applied analogously to field plate trench transistors which have only one trench.

LIST OF REFERENCE SYMBOLS

1 Field plate trench transistor
2 Semiconductor volume
3 Trench
4 Field oxide layer
5 Field electrode
6 Gate oxide layer
7 Gate electrode layer
8 Mesa region
9 Free space
10 Mask layer
d Thickness
a Distance

The invention claimed is:

1. A method for fabricating gate electrodes in a field plate trench transistor having a cell array with a plurality of trenches and a plurality of mesa regions arranged between the trenches, comprising:
   a) providing a gate electrode layer on the cell array such that the gate electrode layer has depressions in locations aligned with the trenches,
   b) providing a mask layer on the cell array,
   c) etching the mask layer such that mask layer residual remains only within the depressions of the gate electrode layer, and
   d) etching the gate electrode layer using the mask layer residual as an etching mask in such a way that gate electrode layer residual remains only in locations aligned with the trenches.

2. The method as claimed in claim 1, wherein step b) further comprises providing the mask layer such that the mask layer has at least a thickness sufficient to fill previously unfilled parts of at least some of the trenches.

3. The method as claimed in claim 1, wherein step a) further comprises providing the gate electrode layer such that a thickness (d) of the gate electrode layer is less than half of a distance (a) between mutually opposite gate oxide layers disposed at an upper part of the trenches.

4. The method as claimed in claim 3, wherein step b) further comprises providing the mask layer such that the mask layer includes photoresist.

5. The method as claimed in claim 3, wherein step b) further comprises providing the mask layer such that the mask layer includes BPSG.

6. The method as claimed in claim 3, wherein step b) further comprises providing the mask layer such that the mask layer includes polysilicon.

7. The method as claimed in claim 6, wherein step b) further comprises providing the mask layer such that the mask layer further includes oxide.

8. The method as claimed in claim 1, wherein step b) further comprises providing the mask layer such that the mask layer comprises at least one of the group consisting of photoresist, BPSG, oxide, polysilicon, or BARC.

9. The method as claimed in claim 1, wherein step b) further comprises providing the mask layer such that the mask layer is planarized by a flow process prior to step c).

10. The method as claimed in claim 1, wherein step b) further comprises providing the mask layer such that the mask layer is planarized by a chemical mechanical removal process prior to step c).

11. The method as claimed in claim 1, further comprising planarizing the mask layer prior to step c) and wherein the mask layer comprises self-planarizing material.

12. The method as claimed in one of claim 1, wherein step b) further comprises providing the mask layer such that the mask layer comprises a layer system of a plurality of materials.

13. The method as claimed in claim 12, wherein the mask layer comprises a first layer and a second layer, and wherein step c) further comprises
   c1) etching the second layer such that residual of the second layer remains only within the depressions of the gate electrode layer; and
   c2) etching the first layer using the residual of the second layer as an etching mask such that residual of the first layer remains only within the depressions of the gate electrode layer.

14. The method as claimed in claim 1, wherein step d) further comprises
   d1) partially etching the gate electrode layer above the mesa regions, and
   d2) removing the residual of the mask layer;
   d3) subsequently etching the gate electrode layer precisely to such an extent that remaining gate electrode layer parts above the mesa regions are etched away.

15. A field plate trench transistor comprising a cell array, the cell array including a plurality of trenches and a plurality of mesa regions arranged between the trenches, each trenching including disposed therein
   a field electrode,
   a first insulation layer enclosing the field electrode,
   a gate electrode layer arranged above the field electrode, and
   at least two mutually opposite second insulation layers adjoining the gate electrode layer; and wherein
a thickness (d) of the gate electrode layer is less than half of a distance (a) between the mutually opposite second insulation layers.

16. The field plate trench transistor as claimed in claim 15, wherein the gate electrode layer has a U-shaped configuration.

17. The field plate trench transistor as claimed in claim 15, wherein the at least two mutually opposite second insulation layers comprise oxide layers.

18. The field plate trench transistor as claimed in claim 15, wherein the at least two mutually opposite second insulation layers extend upward to a vertical level below a vertical level of at least an upper part of the gate electrode layer.

19. The field plate trench transistor as claimed in claim 15, wherein the first insulation layer comprises an oxide layer.

20. The field plate trench transistor as claimed in claim 15, wherein the gate electrode layer has a W-shaped configuration.

* * * * *